United States Patent
Parthasarathy et al.

(10) Patent No.: US 11,081,200 B1
(45) Date of Patent: Aug. 3, 2021

(54) INTELLIGENT PROACTIVE RESPONSES TO OPERATIONS TO READ DATA FROM MEMORY CELLS

(71) Applicant: Micron Technology, Inc., Boise, ID (US)

(72) Inventors: Sivagnanam Parthasarathy, Carlsbad, CA (US); James Fitzpatrick, Laguna Niguel, CA (US); Patrick Robert Khayat, San Diego, CA (US); AbdelHakim S. Alhussien, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/869,494

(22) Filed: May 7, 2020

(51) Int. Cl.
*G11C 16/34* (2006.01)
*G11C 29/12* (2006.01)
*G11C 29/14* (2006.01)
*G11C 16/30* (2006.01)
*G11C 29/44* (2006.01)
*G11C 16/26* (2006.01)
*G11C 29/34* (2006.01)

(52) U.S. Cl.
CPC ........ *G11C 29/12005* (2013.01); *G11C 16/26* (2013.01); *G11C 16/30* (2013.01); *G11C 29/14* (2013.01); *G11C 29/34* (2013.01); *G11C 29/44* (2013.01)

(58) Field of Classification Search
CPC ... G11C 29/12005; G11C 16/26; G11C 16/30; G11C 29/14; G11C 29/34; G11C 29/44

USPC .......................................................... 365/201
See application file for complete search history.

(56) References Cited

U.S. PATENT DOCUMENTS

| 5,864,504 | A | 1/1999 | Tanzawa et al. |
| 9,129,698 | B2* | 9/2015 | Zeng ..................... G11C 16/34 |
| 9,947,401 | B1 | 4/2018 | Navon et al. |
| 2008/0002468 | A1 | 1/2008 | Hemink |
| 2008/0056008 | A1 | 3/2008 | Aritome et al. |
| 2008/0192544 | A1 | 8/2008 | Berman et al. |
| 2009/0063507 | A1 | 3/2009 | Thompson |
| 2009/0144582 | A1 | 6/2009 | Li et al. |
| 2009/0228701 | A1 | 9/2009 | Lin |
| 2010/0027337 | A1 | 2/2010 | Park |
| 2014/0022853 | A1 | 1/2014 | Choi et al. |

(Continued)

OTHER PUBLICATIONS

Memory System Performance Enhancements using Measured Signal and Noise Characteristics of Memory Cells, U.S. Appl. No. 16/714,463, filed Dec. 13, 2019, James Fitzpatrick et al., Docketed New Case—Ready for Examination, Jan. 30, 2020.

(Continued)

*Primary Examiner* — Xiaochun L Chen
(74) *Attorney, Agent, or Firm* — Greenberg Traurig

(57) ABSTRACT

A memory device to generate intelligent, proactive responses to a read command. For example, signal and noise characteristics of a group of memory cells in a memory device are measured to determine a read voltage. An action is identified based on evaluation of the quality of data retrievable using the read voltage from the group of memory cells. While a response indicating the action is provided responsive to the command, the memory device can initiate the action proactively before a subsequent command, following the response, is received.

20 Claims, 8 Drawing Sheets

(56) References Cited

U.S. PATENT DOCUMENTS

| | | | |
|---|---|---|---|
| 2014/0068384 | A1 | 3/2014 | Kwak et al. |
| 2015/0124533 | A1 | 5/2015 | Zeng et al. |
| 2016/0300609 | A1 | 10/2016 | Han et al. |
| 2017/0061832 | A1 | 3/2017 | Ghosh et al. |
| 2018/0254888 | A1 | 9/2018 | Monahan et al. |
| 2018/0330098 | A1 | 11/2018 | Wyseur |
| 2019/0043590 | A1 | 2/2019 | Besinga et al. |
| 2020/0201608 | A1 | 6/2020 | Wallbaum et al. |
| 2020/0273840 | A1 | 8/2020 | Elsherbini et al. |

OTHER PUBLICATIONS

Dynamic Adjustment of Data Integrity Operations of a Memory System Based on Error Rate Classification, U.S. Appl. No. 16/807,056, filed Mar. 2, 2020, Patrick Khayat et al., Docketed New Case—Ready for Examination, Apr. 14, 2020.

Improved Reading of Soft Bits and Hard Bits from Memory Cells, U.S. Appl. No. 16/869,488, James Fitzpatrick et al., Application Undergoing Preexam Processing, May 7, 2020.

Read Soft Bits Through Boosted Modulation Following Reading Hard Bits, U.S. Appl. No. 16/869,492, Sivagnanam Parthasarathy et al., Application Undergoing Preexam Processing, May 7, 2020.

Adaptive and/or Iterative Operations in Executing a Read Command to Retrieve Data from Memory Cells, U.S. Appl. No. 16/807,059, filed Mar. 2, 2020, James Fitzpatrick et al., Docketed New Case—Ready for Examination, Mar. 31, 2020.

Self Adapting Iterative Read Calibration to Retrieve Data from Memory Cells, U.S. Appl. No. 16/807,061, filed Mar. 2, 2020, Abdelhakim Alhussien et al., Docketed New Case—Ready for Examination, Mar. 31, 2020.

Compound Feature Generation in Classification of Error Rate of Data Retrieved from Memory Cells, U.S. Appl. No. 16/807,063, filed Mar. 2, 2020, Sivagnanam Parthasarathy et al., Docketed New Case—Ready for Examination, Mar. 31, 2020.

Classification of Error Rate of Data Retrieved from Memory Cells, U.S. Appl. No. 16/807,065, filed Mar. 2, 2020, Sivagnanam Parthasarathy et al., Docketed New Case—Ready for Examination, Mar. 30, 2020.

International Search Report and Written Opinion, PCT/US2020/063788, dated Mar. 26, 2021.

\* cited by examiner

INTELLIGENT PROACTIVE RESPONSES TO OPERATIONS TO READ DATA FROM MEMORY CELLS

FIELD OF THE TECHNOLOGY

At least some embodiments disclosed herein relate to memory systems in general, and more particularly, but not limited to intelligent proactive responses to read operations in memory systems.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
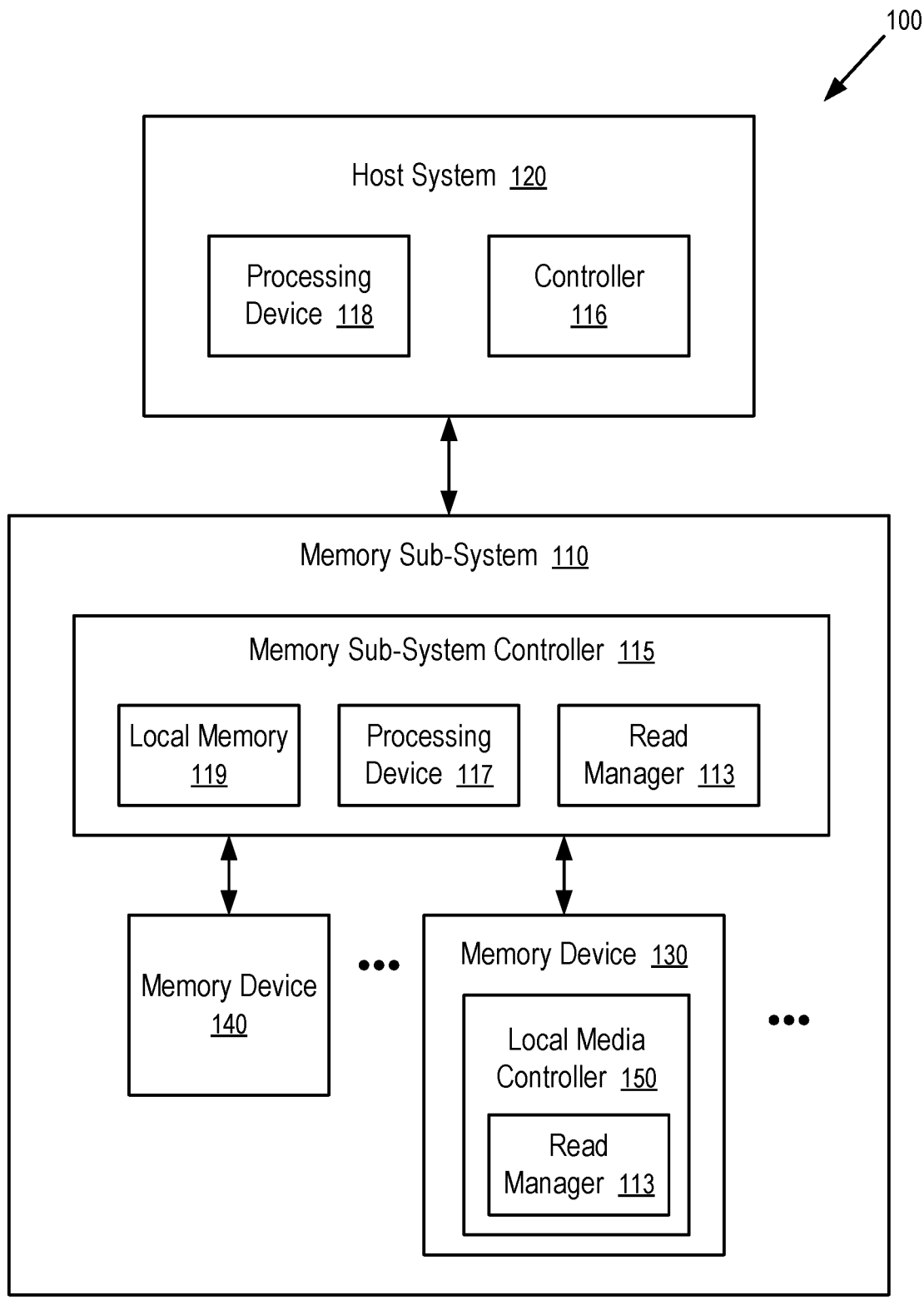
FIG. 1 illustrates an example computing system having a memory sub-system in accordance with some embodiments of the present disclosure.

At least some aspects of the present disclosure are directed to a memory sub-system configured to evaluate the quality of data retrievable from memory cells and, based on the evaluation, provide intelligent proactive responses to operations of reading data from memory cells. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundant information to facilitate error detection and recovery. When data encoded with redundant information is stored in a memory sub-system, the memory sub-system can detect errors in raw, encoded data retrieved from the memory sub-system and/or recover the original, non-encoded data that is used to generated encoded data for storing in the memory sub-system. The recovery operation can be successful (or have a high probability of success) when the raw, encoded data retrieved from the memory sub-system contains less than a threshold amount of errors, or the bit error rate in the encoded data is lower than a threshold. For example, error detection and data recovery can be performed using techniques such as Error Correction Code (ECC), Low-Density Parity-Check (LDPC) code, etc.

Further, an array of independent memory devices can be configured to store redundant information to facilitate data recovery. For example, a technique of Redundant Array of Independent NAND (RAIN) can be used to store redundant information, in a way similar to a redundant array of independent disks (RAID), to provide redundancy. Since redundant data is stored across multiple independent devices, the original data can be recovered even when one of the independent devices fails completely and losses all of the data stored in the failed device. When the data in a memory device is determined to have corrupted, the memory sub-system can recover the data based on redundant information stored in other memory devices (e.g., through RAIN operations).

When the encoded data retrieved from the memory cells of the memory sub-system has too many errors for successful decoding, the memory sub-system may retry the execution of the read command with adjusted parameters for reading the memory cells. However, it is inefficient to search for a set of parameters through multiple read retry with multiple rounds of calibration, reading, decoding failure, and retry, until the encoded data retrieved from the memory cells can be decoded into error free data. For example, blind searching for the optimized read voltages is inefficient. For example, one or more commands being injected between retry reads can lead to long latency for recovering data from errors.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

At least some aspects of the present disclosure address the above and other deficiencies by measuring signal and noise characteristics of memory cells, evaluating the quality of data retrievable from the memory cells based on the signal and noise characteristics, and proactively taking actions to facilitate recovery of error free data in a memory sub-system. The quality evaluation can be performed without using the data retrieved from memory cells in the memory sub-system. For example, the signal and noise characteristics of memory cells can be used to calculate a read voltage calibrated/optimized for reading the memory cells. Further, based on the signal and noise characteristics, the level of bit error rate in data retrievable from the memory cells using the calibrated/optimized read voltage can be classified or estimated before the data is retrieved from the memory cells. The estimated/classified level of bit error rate can be used to decide whether to recalibrate the read voltage, to retry read operations, to read additional data to facilitate decoding using a sophisticated technique, to search for a voltage range for calibrating/optimizing the read voltage, and/or to perform further data recovery operations such as RAIN operations.

For example, when a read command is transmitted from a controller of a memory sub-system to a memory device enclosed in an integrated circuit package, the memory device can generate the signal and noise characteristics to evaluate the quality of the data retrievable from the memory cells in the memory device. Instead of simply providing the data retrieved from the memory cells for the controller to analyze and/or decode, the memory device can provide the signal and noise characteristics and/or the results of quality evaluation to the controller, suggest next actions for successful data recovery, and/or proactively initiate a next action to reduce the time to successful data recovery. Such enriched responses by the memory device to a read command can enable a new paradigm of communication and cooperation between the controller and the memory device.

For example, in response to a command from a controller of a memory sub-system, a memory device can automatically calibrate a voltage for reading a group of memory cells based on signal and noise characteristics measured for memory cells. The signal and noise characteristics measured for memory cells can be based on a bit count of memory cells in the group having a predetermined status when a test voltage is applied to read the memory cells. Different test voltages that are separated from one another by a predetermined voltage interval or gap can have different bit counts. The difference between bit counts of two adjacent test voltages provides the count difference for the voltage interval or gap between the adjacent test voltages. An optimized read voltage can be found at a voltage where the distribution of the count differences over voltage reaches a minimum.

When one of the count differences is smaller than its two adjacent neighbors, a minimum can be determined to be in the voltage interval or gap of the smallest count difference. An improved location of the optimized read voltage within the gap can be computed based on a ratio of adjacent neighbors, as further discussed below in connection with FIG. 5. Such an improved location of the optimized read voltage can be identified as optimal.

When no count difference is between two higher adjacent neighbors, the optimized read voltage can be identified as in a voltage interval or gap corresponding to a count difference that is smaller than two of the next two count differences. An improved location of the optimized read voltage within the gap can be computed based on a ratio of bit counts at the test voltages of the two ends of the gap, as further discussed below in connection with FIG. 6. Such an improved location of the optimized read voltage can be identified as sub-optimal.

In some instances, the optimized read voltage of a group of memory cells may have changed significantly such that an initial estimation of the optimized read voltage is too far away from the actual optimized read voltage. Since the test voltages for calibrating/optimizing the read voltage are configured within a narrow voltage range based on the initial estimation of the optimized read voltage, the actual optimized read voltage can be outside of the narrow range of test voltages used to measure the signal and noise characteristics and identify an estimate of the optimized read voltage (e.g., using the techniques of FIGS. 5 and 6). As a result, the optimized read voltage estimated using the techniques of FIGS. 5 and 6 can be located in the incorrect test voltage range configured to measure the signal and noise characteristics. In a wider possible voltage, the narrow test voltage range may be at a wrong location globally.

Figure 5:
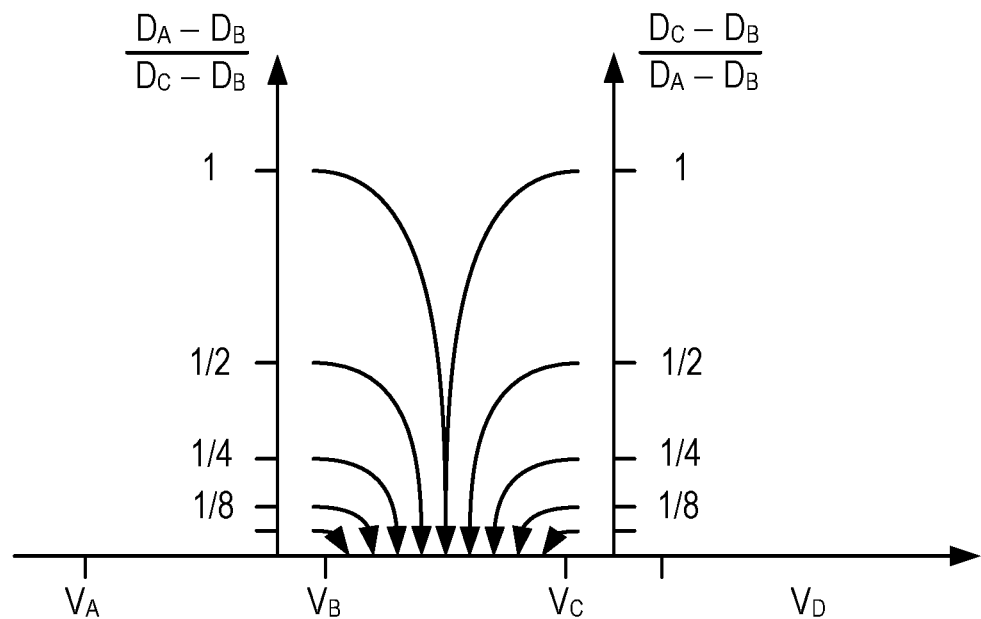
Figure 6:
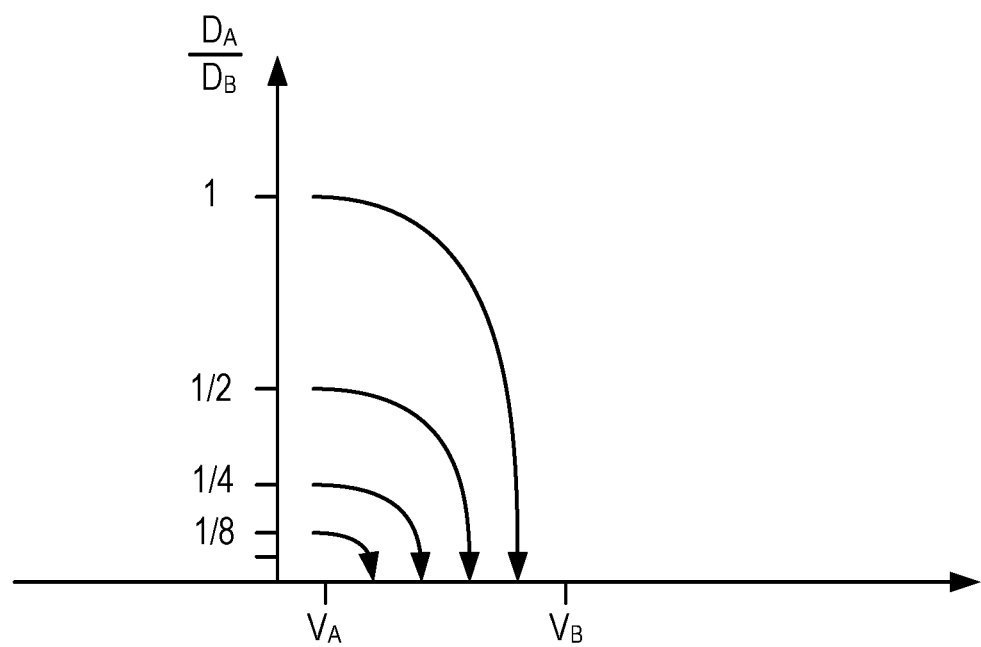

Whether the optimized read voltage estimated using the techniques of FIGS. 5 and 6 is approximately in a correct voltage range globally can be checked based on a statistical distribution of the threshold voltages of the group of memory cells.

For example, a statistical distribution of the threshold voltage of a memory cell can indicate that, in a group of memory cells, the memory cells having threshold voltages higher than the actual optimized read voltage for the group should be within a percentage range of the memory cells in the group. Thus, when reading the group of memory cells using an optimized read voltage estimated using the techniques of FIGS. 5 and 6, the memory device can count the number of memory cells in the group that have threshold voltages above the estimated optimized read voltage. If the ratio between the count of such memory cells and the population of memory cells in the group is outside of a predetermined percentage range known for the actual optimized read voltage, the estimated optimized read voltage can be considered to be in a wrong voltage range. In such a situation, the memory device and/or the memory sub-system can adjust the test voltage range to search for an improved optimized read voltage.

For example, memory cells can be programmed a page at a time; and a page of data can be stored in a group of cells on a same wordline. The group of cells can be identified by a particular wordline and a particular sub-block in one example; and in another example, the group can include all of the memory cells of a particular wordline. When the memory cells are programmed to store multiple bits per memory cell, different bits of a memory cell can be part of different pages. For example, when a memory cell is programmed to store four bits (e.g., in a QLC mode), a first bit can be part of a first page (e.g., referred to as lower page); a second bit can be part of a second page (e.g., referred to as upper page); a third bit can be part of a third page (e.g., referred to as extra page); and a fourth bit can be part of a fourth page (e.g., referred to as top page). Each page (e.g., lower page, upper page, extra page, top page) includes the set of corresponding bits in memory cells in the group.

After determining a set of optimized read voltages for reading the four pages (e.g., lower page, upper page, extra page, top page) from a group of memory cells in a QLC mode, the memory device can count, for each of the pages, the memory cells having threshold voltages that are higher than the highest one of the optimized read voltages used to read the corresponding page. The ratio of the cell count over the entire population of memory cells in the corresponding page can be compared to a predetermined range. If the ratio is outside of the predetermined range, at least some of the optimized read voltages are in the incorrectly positioned test voltage ranges for their calibration.

For example, the count of memory cells in a top page having threshold voltages higher than the highest optimized read voltages used in read the top page should be between 1/32 to 3/32 of the memory cells in the top page. If the count is outside of the range for a set of read voltages optimized/calibrated using the techniques of FIGS. 5 and 6, some of the test voltage ranges do not contain the actual optimized read voltages; and the optimized/calibrated read voltages calculated based on the test voltage ranges are determined to be in the wrong voltage ranges.

Similarly, the ratio of cell count of an extra page can be compared to the range of 3/32 to 5/32; the ratio of cell count of an upper page can be compared to the range of 7/32 to 9/32; and the ratio of cell count of a lower page can be compared to the range of 15/32 to 17/32.

If an optimized/calibrated read voltage is found to be based on a wrong test voltage range, the memory device can adjust the test voltage range to calibrate the read voltage.

After an optimized read voltage is calculated (e.g., using techniques illustrated in FIGS. 3-6), the memory device can use the optimized read voltage to read memory cells and obtain hard bit data, and optionally boost modulating the applied read voltage(s) to adjacent voltages to further read the memory cells for soft bit data.

Preferably, the operations of reading the hard bit data and reading the soft bit data are scheduled together during the execution of the read command to minimize the time required to obtain the soft bit data and/or to avoid delay that can be caused by processing a separate read command, or by intervening operations on the memory cells.

Optionally, the signal and noise characteristics measured for memory cells are further used to evaluate the quality of the hard bit data retrieved using the calibrated read voltage(s). The evaluation can be performed at least in part concurrently with the reading of the hard bit data. Based on the evaluated quality of the hard bit data, the memory device may selectively read and/or transmit the soft bit data.

The hard bit data retrieved from a group of memory cells using the calibrated/optimized read voltage can be decoded using an error detection and data recovery technique, such as Error Correction Code (ECC), Low-Density Parity-Check (LDPC) code, etc. When the error rate in the hard bit data is high, the soft bit data, retrieved from the memory cell using read voltages with predetermined offsets from the calibrated/optimized read voltage, can be used to assist the decoding of the hard bit data. When the soft bit data is used, the error recovery capability is improved in decoding the hard bit data.

Optionally, a controller of a memory sub-system can initially send a command to a memory device to read hard bit data with calibrated read voltage; and in response to a failure in the decoding of the hard bit data, the controller can further send a command to the memory device to read the corresponding soft bit data. Such an implementation is efficient when the likelihood of a failure in decoding the hard bit data without soft bit data is lower than a threshold. However, when the likelihood is above the threshold, the overhead of sending the separate command becomes disadvantageous.

When the likelihood of using soft bit data is above a threshold, it is advantageous to transmit a single command to the memory device to cause the memory device to read the soft bit data and the hard bit data together. Further, the memory device can use the signal and noise characteristics of the memory cells to predict whether the soft bit data is likely to be used by the controller. If the likelihood of using of the soft bit data is lower than a threshold, the memory device can skip reading the soft bit data.

For example, during the calibration operation, the memory device can measure the signal and noise characteristics of the memory cells and use the measurements to calculate an optimized/calibrated read voltage for reading the memory cells. Once the optimized/calibrated read voltage is obtained, the memory device reads the memory cells to obtain the hard bit data. Subsequently, the memory device adjusts the already applied optimized/calibrated read voltage (e.g., through boosted modulation) to a predetermined offset (e.g., 50 mV) below the optimized/calibrated read voltage to retrieve a set of data, and further adjusts the currently applied voltage (e.g., through boosted modulation) to the predetermined offset above the optimized/calibrated read voltage to retrieve another set of data. The logic operation of XOR (exclusive or) of the two sets of data at the both sides of the offset (e.g., 50 mV) from the optimized/calibrated read voltage provides the indication of whether the memory cells provide the same reading at the offset locations around the optimized/calibrated read voltage. The result of the XOR operation can be used as soft bit data for decoding the hard bit data read using the optimized/calibrated read voltage. In some implementations, a larger offset (e.g., 90 mV) can be used to read another set of soft bit data that indicates whether the memory cells provide the same reading at the locations according to the larger offset (e.g., 90 mV) around the optimized/calibrated read voltage.

For example, in response to a read command from a controller of the memory sub-system, a memory device of the memory sub-system performs an operation to calibrate a read voltage of memory cells. The calibration is performed by measuring signal and noise characteristics through reading the memory cells at a number of voltage levels that are near an estimated location of the optimized read voltage. An optimized read voltage can be calculated based on statistical data of the results generated from reading the memory cells at the voltage levels. For example, the statistical data can include and/or can be based on counts measured by calibration circuitry at the voltage levels. Optionally, such signal and noise characteristics can be measured for sub-regions in parallel to reduce the total time for measuring the signal and noise characteristics. The statistical data of the results generated from reading the memory cells at the voltage levels can be used to predict whether the decoding of the hard bit data retrieved using the optimized read voltage is likely to require the use of soft bit data for successful decoding. Thus, the transmission of the soft bit data can be performed selectively based on the prediction.

For example, a predictive model can be generated through machine learning to estimate or evaluate the quality of data that can be retrieved from a set of memory cells using the calibrated/optimized read voltage(s). The predictive model can use features calculated from the measured signal and noise characteristics of the memory cells as input to generate a prediction. The reading and/or transmission of the soft bit data can be selectively skipped based on the prediction.

For example, as a response to a read command from the controller of the memory-subsystem, the memory device can decide that the signal and noise characteristics indicate a need for soft bit data in coding, and thus suggest reading soft bit data and inform the controller to extend the read time period for facilitate the reading of the soft bit data as part of the process of read the hard bit data from the memory cells.

The memory device can proactively start the process of reading the soft bit data in connection with reading the hard bit data while transmitting the suggestion to the controller.

For example, as a response to a read command from the controller of the memory-subsystem, the memory device can decide that the signal and noise characteristics indicate a need for a read retry and thus skip the data transmission of the current read operation. The memory device can proactively start the read retry while transmitting the suggestion of read retry to the controller such that the execution time for a read retry command from the controller can be reduced.

In some instances, the memory device can decide, based on the signal and noise characteristics generated during the execution of a read command to use a decoder implemented via the controller to decode the data retrieved from the memory cells in the memory device. The decoder implemented via the controller can use resources not available in the memory device for success decoding. For example, the decoder implemented via the controller can use a sophisticated decoding technique to improve error recovery capability. For example, the decoder implemented via the controller can use redundant information implemented via a redundant array of independent memory devices (e.g., RAIN). In other instances, the memory device can decide that a low power decoder implemented in the memory device is sufficient to decode the data retrieved from the memory cells. Thus, the memory device can proactively start decoding while information the controller that the decoding is being performed on the memory device.

For example, when the memory device determines that some of the optimized/calibrated read voltages are in the wrong voltage ranges, the memory device can suggest a further calibration/search for the optimized read voltages. The memory device can proactively start the calibration/search while reporting or suggesting the further calibration/search.

For example, when the signal and noise characteristics indicate that the hard bit data has a low error rate, the memory sub-system can decide to decode without soft bit data. The memory device can proactively start the decoding of the hard bit data using a decoder that has power consumption lower than other decoders.

For example, when the signal and noise characteristics indicate that the hard bit data has a high error rate and the optimized/calibrated read voltages are optimal, the memory sub-system can decide to capture soft bit data to decode the hard bit data using a decoder that has improved error recovery capability. The memory device can proactively start the capturing of the soft bit data.

For example, when the signal and noise characteristics indicate that the hard bit data has a high error rate and the optimized/calibrated read voltages are sub-optimal, the memory sub-system can decide to adjust calibration/optimization of the read voltages. The memory device can proactively start the next calibration/optimization.

For example, when the signal and noise characteristics indicate that the initial optimized/calibrated read voltages are in wrong voltage ranges, the memory sub-system can decide to search for correct voltage ranges for read voltage optimization/calibration. The memory device can proactively start the search and/or suggest voltage ranges.

For example, when the signal and noise characteristics indicate that it is unlikely to recover data from a group of memory cells in the memory device, the memory sub-system can decide to use RAIN operations to recover the data from redundant information stored in other memory devices.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130,140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 and/or a memory device 130 can include a read manager 113 configured to determine a proactive response for reading data from a group of memory cells based on signal and noise characteristics of the group of memory cells. In some embodiments, the controller 115 in the memory sub-system 110 includes at least a portion of the read manager 113. In other embodiments, or in combination, the controller 116 and/or the processing device 118 in the host system 120 includes at least a portion of the read manager 113. For example, the controller 115, the controller 116, and/or the processing device 118 can include logic circuitry implementing the read manager 113. For example, the controller 115, or the processing device 118 (processor) of the host system 120, can be configured to execute instructions stored in memory for performing the operations of the read manager 113 described herein. In some embodiments, the read manager 113 is implemented in an integrated circuit chip disposed in the memory sub-system 110. In other embodiments, the read manager 113 can be part of firmware of the memory sub-system 110, an operating system of the host system 120, a device driver, or an application, or any combination therein.

For example, the read manager 113 implemented in the controller 115 can transmit a read command or a calibration command to the memory device 130. In response to such a command, the read manager 113 implemented in the memory device 130 is configured to measure signal and noise characteristics of a group of memory cells by reading the group of memory cells at a plurality of test voltages configured near an estimated location of the optimized read voltage for the group of memory cells. The test voltages can be configured to be equally spaced by a same amount of voltage gap. From a result of reading the group of memory cells at a test voltage, a bit count of memory cells in the group are determined to be storing or reporting a predetermined bit (e.g., 0 or 1 corresponding to memory cells being conductive or non-conductive at the test voltage) when the group is read at the test voltage. A count difference can be computed from the bit counts of each pair of adjacent test voltages. The read manager 113 compares the count difference to identify a voltage interval that contains an optimized read voltage and then estimates a location in the voltage interval for the optimized read voltage based on comparing the bit counts or count differences that are closest to the voltage interval. The estimated location can be used as the optimized read voltage to read hard bit data; and voltages having predetermined offsets from the optimized read voltage can be used to read soft bit data.

The quality of the hard bit data and/or the soft bit data can be evaluated based on the signal and noise characteristics of the group of memory cells that are used to determine the estimated location of the optimized read voltage. Based on the evaluated quality, the memory sub-system can suggest proactive actions such as decode hard bit data without soft bit data, read soft bit data, refine calibration/optimization of the read voltages, search for test voltage ranges to perform calibration/optimization of the read voltages, etc.

Figure 2:
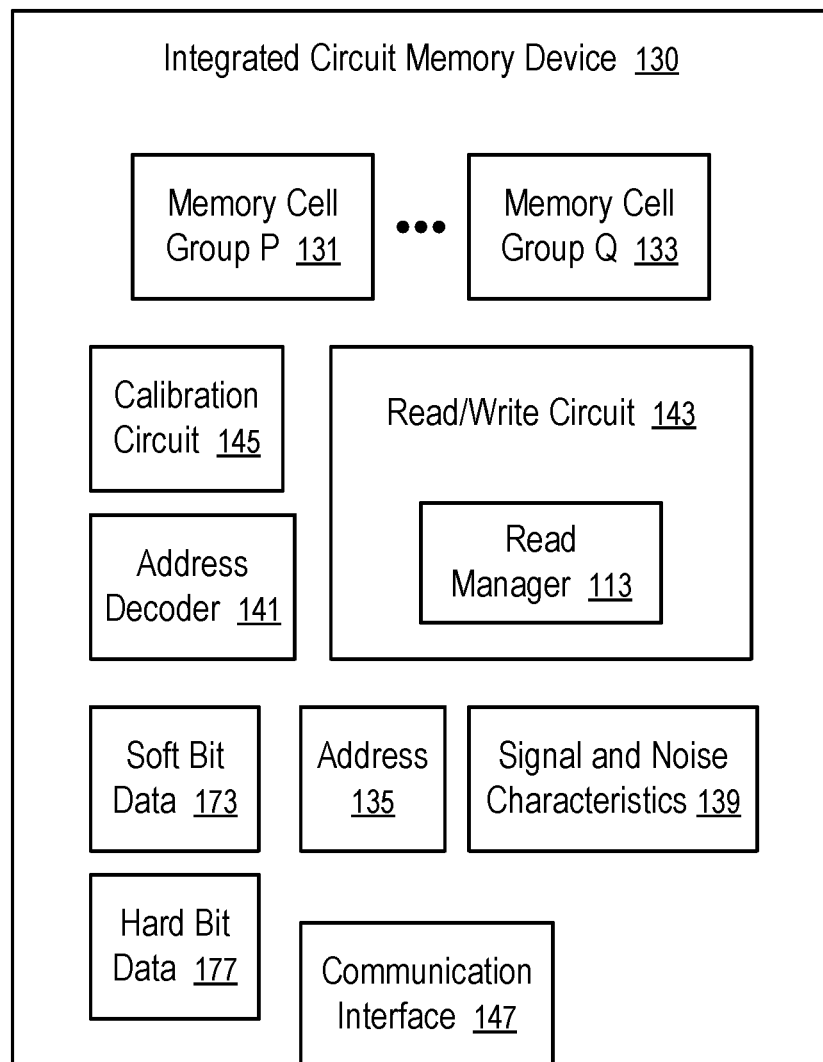
FIG. 2 illustrates an integrated circuit memory device having a calibration circuit configured to measure signal and noise characteristics according to one embodiment.

FIG. 2 illustrates an integrated circuit memory device 130 having a calibration circuit 145 configured to measure signal and noise characteristics according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, ..., 133 of memory cells that can be formed in one or more integrated circuit dies. A typical memory cell in a group 131, ..., 133 can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve both hard bit data 177 and soft bit data 173 from the memory address 135, and provide at least the hard bit data 177 as a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the hard bit data 177 and the soft bit data 173 of memory cells at the address 135.

The integrated circuit memory device 130 has a calibration circuit 145 configured to determine measurements of signal and noise characteristics 139 of memory cells in a group (e.g., 131, ..., or 133). For example, the statistics of memory cells in a group or region that has a particular state at one or more test voltages can be measured to determine the signal and noise characteristics 139. Optionally, the signal and noise characteristics 139 can be provided by the memory device 130 to the controller 115 of a memory sub-system 110 via the communication interface 147.

In at least some embodiments, the calibration circuit 145 determines the optimized read voltage(s) of the group of memory cells based on the signal and noise characteristics 139. In some embodiments, the signal and noise characteristics 139 are further used in the calibration circuit 145 to determine whether the error rate in the hard bit data 177 is sufficiently high such that it is preferred to decode the hard bit data 177 in combination with the soft bit data 173 using a sophisticated decoder. When the use of the soft bit data 173 is predicted, based on the prediction/classification of the error rate in the hard bit data 177, the read manager 113 can transmit both the soft bit data 173 and the hard bit data 177 to the controller 115 of the memory sub-system 110.

For example, the calibration circuit 145 can measure the signal and noise characteristics 139 by reading different responses from the memory cells in a group (e.g., 131, . . . , 133) by varying operating parameters used to read the memory cells, such as the voltage(s) applied during an operation to read data from memory cells.

For example, the calibration circuit 145 can measure the signal and noise characteristics 139 on the fly when executing a command to read the hard bit data 177 and the soft bit data 173 from the address 135. Since the signal and noise characteristics 139 is measured as part of the operation to read the hard bit data 177 from the address 135, the signal and noise characteristics 139 can be used in the read manager 113 with reduced or no penalty on the latency in the execution of the command to read the hard bit data 177 from the address 135.

The read manager 113 of the memory device 130 is configured to use the signal and noise characteristics 139 to determine the voltages used to read memory cells identified by the address 135 for both hard bit data and soft bit data and to determine whether to transmit the soft bit data to the memory sub-system controller 115.

For example, the read manager 113 can use a predictive model, trained via machine learning, to predict the likelihood of the hard bit data 177 retrieved from a group of memory cells (e.g., 131 or 133) failing a test of data integrity. The prediction can be made based on the signal and noise characteristics 139. Before the test is made using error-correcting code (ECC) and/or low-density parity-check (LDPC) code, or even before the hard bit data 177 is transferred to a decoder, the read manager 113 uses the signal and noise characteristics 139 to predict the result of the test. Based on the predicted result of the test, the read manager 113 determines whether to transmit the soft bit data to the memory sub-system controller 115 in a response to the command.

For example, if the hard bit data 177 is predicted to decode using a low-power decoder that uses hard bit data 177 without using the soft bit data 173, the read manager 113 can skip the transmission of the soft bit data 173 to the memory sub-system controller 115; and the read manager 113 provides the hard bit data 177, read from the memory cells using optimized read voltages calculated from the signal and noise characteristics 139, for decoding by the low-power decoder. For example, the low-power decoder can be implemented in the memory sub-system controller 115. Alternatively, the low-power decoder can be implemented in the memory device 130; and the read manager 113 can provide the result of the lower-power decoder to the memory sub-system controller 115 as the response to the received command.

For example, if the hard bit data 177 is predicted to fail in decoding in the low-power decoder but can be decoded using a high-power decoder that uses both hard bit data and soft bit data, the read manager 113 can decide to provide both the hard bit data 177 and the soft bit data 173 for decoding by the high-power decoder. For example, the high-power decoder can be implemented in the controller 115. Alternatively, the high-power decoder can be implemented in the memory device 130.

Optionally, if the hard bit data 173 is predicted to fail in decoding in decoders available in the memory sub-system 110, the read manager 113 can decide to skip transmitting the hard bit data 173 to the memory sub-system controller 115, initiate a read retry immediately, such that when the memory sub-system controller 115 requests a read retry, at least a portion of the read retry operations is performed to reduce the time for responding to the request from the memory sub-system controller 115 for a read retry. For example, during the read retry, the read manager 113 instructs the calibration circuit 145 to perform a modified calibration to obtain a new set of signal and noise characteristics 139, which can be further used to determine improved read voltages.

The data from the memory cells identified by the address (135) can include hard bit data 177 and soft bit data 173. The hard bit data 177 is retrieved using optimized read voltages. The hard bit data 177 identifies the states of the memory cells that are programmed to store data and subsequently detected in view of changes caused by factors, such as charge loss, read disturb, cross-temperature effect (e.g., write and read at different operating temperatures), etc. The soft bit data 173 is obtained by reading the memory cells using read voltages centered at each optimized read voltage with a predetermined offset from the center, optimized read voltage. The XOR of the read results at the read voltages having the offset indicates whether the memory cells provide different read results at the read voltages having the offset. The soft bit data 173 can include the XOR results. In some instances, one set of XOR results is obtained based on a smaller offset; and another set of XOR results is obtained based on a larger offset. In general, multiple sets of XOR results can be obtained for multiple offsets, where each respective offset is used to determine a lower read voltage and a higher read voltage such that both the lower and higher read voltages have the same respective offset from an optimized read voltage to determine the XOR results.

Figure 3:
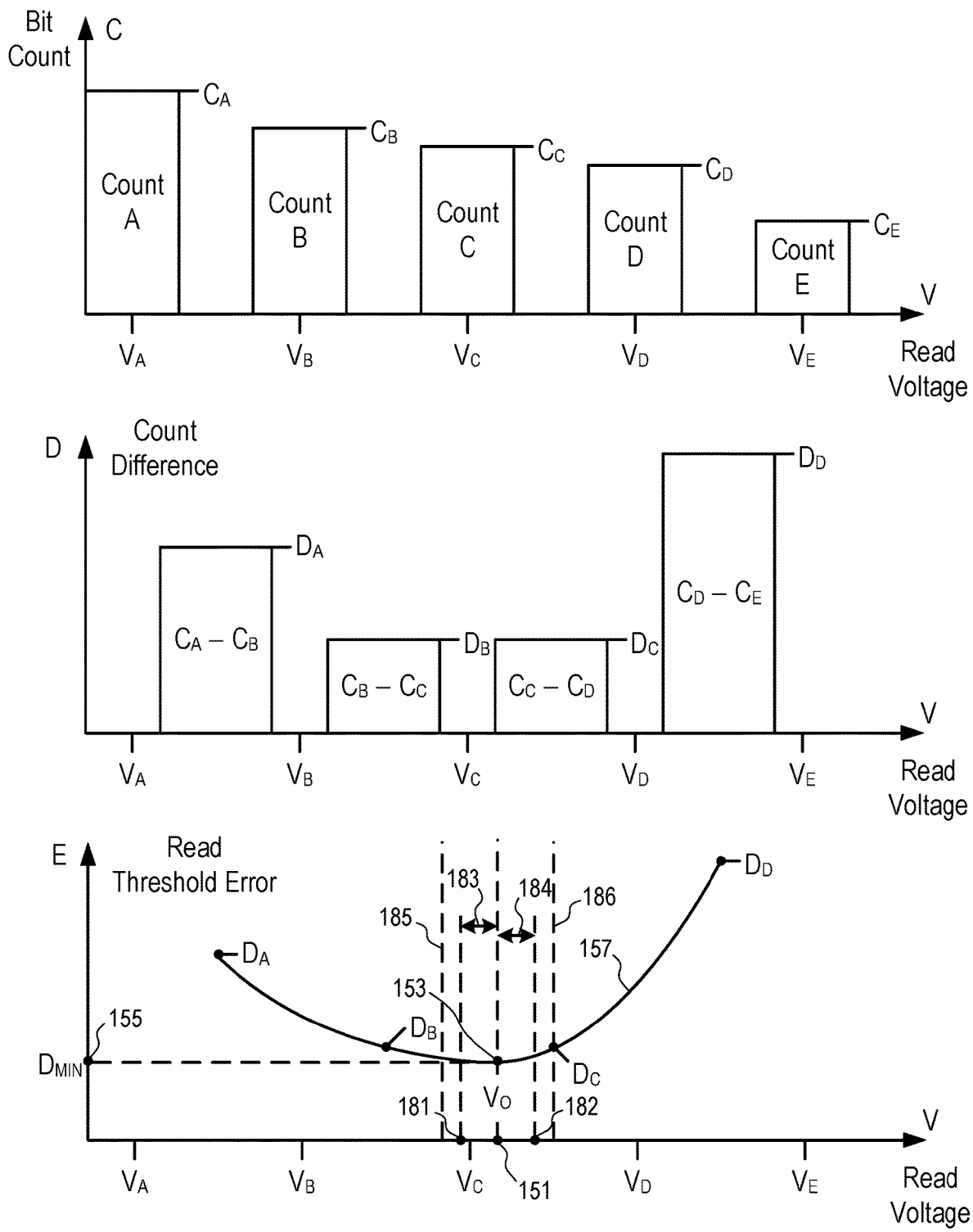
FIG. 3 shows an example of measuring signal and noise characteristics to improve memory operations according to one embodiment.

FIG. 3 shows an example of measuring signal and noise characteristics 139 to improve memory operations according to one embodiment.

In FIG. 3, the calibration circuit 145 applies different read voltages $V_A$, $V_B$, $V_C$, $V_D$, and $V_E$ to read the states of memory cells in a group (e.g., 131, . . . , or 133). In general, more or less read voltages can be used to generate the signal and noise characteristics 139.

As a result of the different voltages applied during the read operation, a same memory cell in the group (e.g., 131, . . . , or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ can be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 145 can measure the bit counts by applying the read voltages $V_A$, $V_B$, $V_C$, $V_D$, and $V_E$ one at a time on the group (e.g., 131, . . . , or 133) of memory cells.

Alternatively, the group (e.g., 131, . . . , or 133) of memory cells can be configured as multiple subgroups; and the calibration circuit 145 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, . . . , or 133). Thus, the time duration of obtaining the counts $C_A$, $C_B$, $C_C$, $C_D$, and $C_E$ can be reduced.

In some embodiments, the bit counts $C_A$, $C_B$, $C_C$, $C_D$, and $C_E$ are measured during the execution of a command to read the data from the address 135 that is mapped to one or more memory cells in the group (e.g., 131, . . . , or 133). Thus, the controller 115 does not need to send a separate command to request for the signal and noise characteristics 139 that is based on the bit counts $C_A$, $C_B$, $C_C$, $C_D$, and $C_E$.

The differences between the bit counts of the adjacent voltages are indicative of the errors in reading the states of the memory cells in the group (e.g., 133, . . . , or 133).

For example, the count difference $D_A$ is calculated from $C_A$-$C_B$, which is an indication of read threshold error introduced by changing the read voltage from $V_A$ to $V_B$.

Similarly, $D_B = C_B - C_C$; $D_C = C_C - C_D$; and $D_D = C_D - C_E$.

The curve 157, obtained based on the count differences $D_A$, $D_B$, $D_C$, and $D_D$, represents the prediction of read threshold error E as a function of the read voltage. From the curve 157 (and/or the count differences), the optimized read voltage $V_O$ can be calculated as the point 153 that provides the lowest read threshold error $D_{MIN}$ on the curve 157.

In one embodiment, the calibration circuit 145 computes the optimized read voltage $V_O$ and causes the read/write circuit 143 to read the data from the address 135 using the optimized read voltage $V_O$.

Alternatively, the calibration circuit 145 can provide, via the communication interface 147 to the controller 115 of the memory sub-system 110, the count differences $D_A$, $D_B$, $D_C$, and $D_D$ and/or the optimized read voltage $V_O$ calculated by the calibration circuit 145.

FIG. 3 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimized read voltage, where the test voltages in each set of statistical data are configured in the vicinity of the expected location of the corresponding optimized read voltage. Thus, the signal and noise characteristics 139 measured for a memory cell group (e.g., 131 or 133) can include multiple sets of statistical data measured for the multiple threshold voltages respectively.

For example, the controller 115 can instruct the memory device 130 to perform a read operation by providing an address 135 and at least one read control parameter. For example, the read control parameter can be a suggested read voltage.

The memory device 130 can perform the read operation by determining the states of memory cells at the address 135 at a read voltage and provide the data according to the determined states.

During the read operation, the calibration circuit 145 of the memory device 130 generates the signal and noise characteristics 139. The data and the signal and noise characteristics 139 are provided from the memory device 130 to the controller 115 as a response. Alternatively, the processing of the signal and noise characteristics 139 can be performed at least in part using logic circuitry configured in the memory device 130. For example, the processing of the signal and noise characteristics 139 can be implemented partially or entirely using the processing logic configured in the memory device 130. For example, the processing logic can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

The signal and noise characteristics 139 can be determined based at least in part on the read control parameter. For example, when the read control parameter is a suggested read voltage for reading the memory cells at the address 135, the calibration circuit 145 can compute the read voltages $V_A$, $V_B$, $V_C$, $V_D$, and $V_E$ that are in the vicinity of the suggested read voltage.

The signal and noise characteristics 139 can include the bit counts $C_A$, $C_B$, $C_C$, $C_D$, and $C_E$. Alternatively, or in combination, the signal and noise characteristics 139 can include the count differences $D_A$, $D_B$, $D_C$, and $D_D$.

Optionally, the calibration circuit 145 uses one method to compute an optimized read voltage $V_O$ from the count differences $D_A$, $D_B$, $D_C$, and $D_D$; and the controller 115 uses another different method to compute the optimized read voltage $V_O$ from the signal and noise characteristics 139 and optionally other data that is not available to the calibration circuit 145.

When the calibration circuit 145 can compute the optimized read voltage $V_O$ from the count differences $D_A$, $D_B$, $D_C$, and $D_D$ generated during the read operation, the signal and noise characteristics can optionally include the optimized read voltage $V_O$. Further, the memory device 130 can use the optimized read voltage $V_O$ in determining the hard bit data in the data from the memory cells at the address 135. The soft bit data in the data can be obtained by reading the memory cells with read voltages that are a predetermined offset away from the optimized read voltage $V_O$. Alternatively, the memory device 130 uses the controller-specified read voltage provided in the read control parameter in reading the data.

The controller 115 can be configured with more processing power than the calibration circuit 145 of the integrated circuit memory device 130. Further, the controller 115 can have other signal and noise characteristics applicable to the memory cells in the group (e.g., 133, . . . , or 133). Thus, in general, the controller 115 can compute a more accurate estimation of the optimized read voltage $V_O$ (e.g., for a subsequent read operation, or for a retry of the read operation).

In general, it is not necessary for the calibration circuit 145 to provide the signal and noise characteristics 139 in the form of a distribution of bit counts over a set of read voltages, or in the form of a distribution of count differences over a set of read voltages. For example, the calibration circuit 145 can provide the optimized read voltage $V_O$ calculated by the calibration circuit 145, as signal and noise characteristics 139.

The calibration circuit 145 can be configured to generate the signal and noise characteristics 139 (e.g., the bit counts, or bit count differences) as a byproduct of a read operation. The generation of the signal and noise characteristics 139 can be implemented in the integrated circuit memory device 130 with little or no impact on the latency of the read operation in comparison with a typical read without the generation of the signal and noise characteristics 139. Thus, the calibration circuit 145 can determine signal and noise characteristics 139 efficiently as a byproduct of performing a read operation according to a command from the controller 115 of the memory sub-system 110.

In general, the calculation of the optimized read voltage $V_O$ can be performed within the memory device 130, or by a controller 115 of the memory sub-system 111 that receives the signal and noise characteristics 139 as part of enriched status response from the memory device 130.

The hard bit data 177 can be obtained by applying the optimized read voltage $V_O$ on the group of memory cells and determining the state of the memory cells while the memory cells are subjected to the optimized read voltages $V_O$.

The soft bit data 173 can be obtained by applying the read voltages 181 and 182 that are offset from the optimized read voltage $V_O$ with a predetermined amount. For example, the read voltage 181 is at the offset 183 of the predetermined amount lower from the optimized read voltage $V_O$; and the read voltage 182 is at the offset 184 of the same predetermined amount higher from the optimized read voltage $V_O$. A memory cell subjected to the read voltage 181 can have a state that is different from the memory cell subjected to the read voltage 182. The soft bit data 173 can include or indicate the XOR result of the data read from the memory cell using the read voltages 181 and 182. The XOR result shows whether the memory cell subjected to the read voltage 181 has the same state as being to the read voltage 182.

Figure 4:
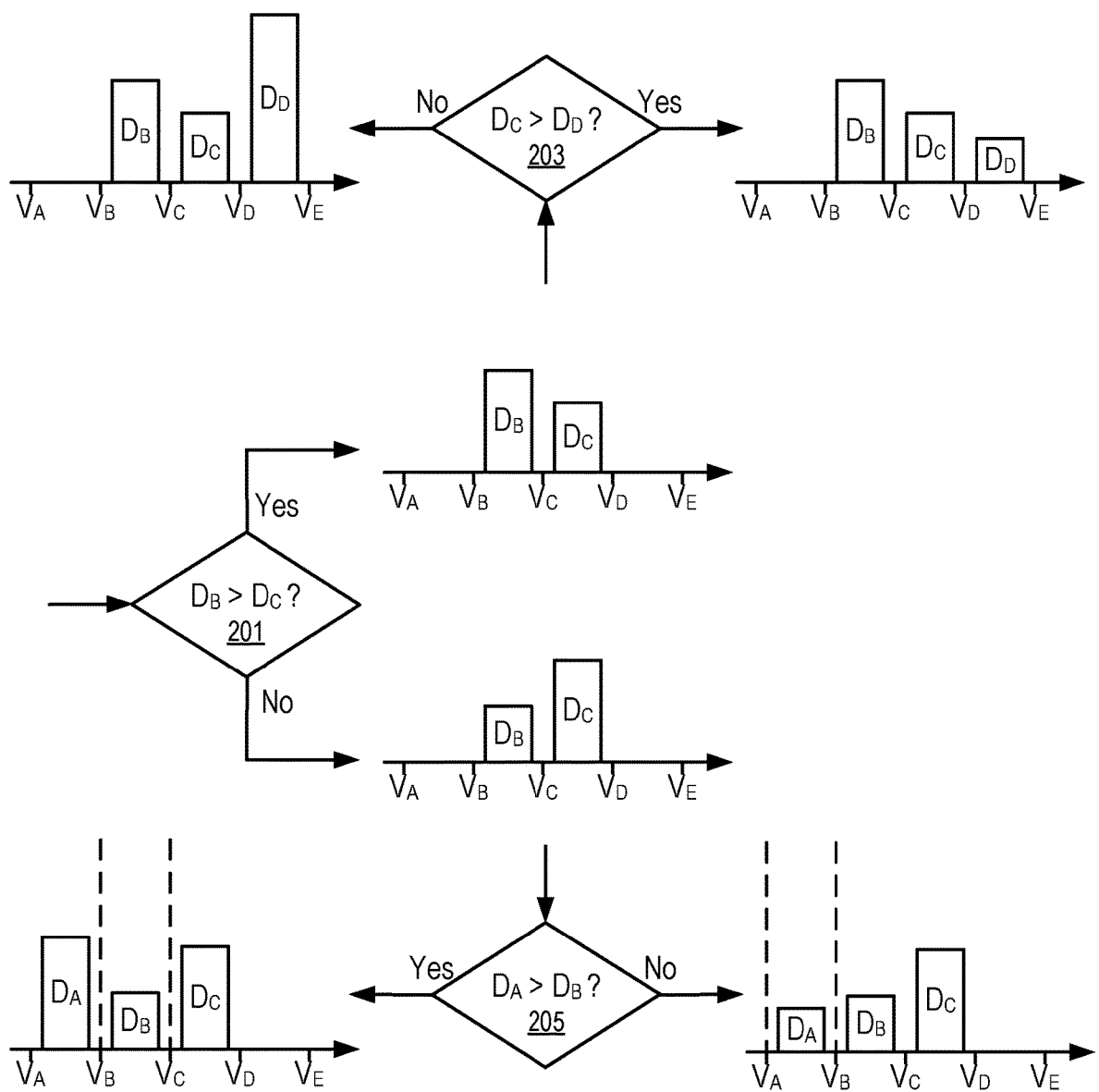
FIGS. 4-6 illustrate a technique to compute an optimized read voltage from count differences according to one embodiment.

FIGS. 4-6 illustrate a technique to compute an optimized read voltage from count differences according to one embodiment. The technique of FIGS. 4-6 simplifies the computation for calculating the optimized read voltage $V_O$ such that the computation can be implemented using reduced computing power and/or circuitry.

The computation illustrated in FIGS. 4-6 can be performed based on the bit counts and count differences illustrated in FIG. 3 for test voltages $V_A$, $V_B$, $V_C$, $V_D$, and $V_E$.

In FIG. 4, an operation 201 is performed to compare the two center count differences $D_B$ and $D_C$.

If $D_B$ is greater than $D_C$, it can be assumed that a minimal can be found on the higher half of the test voltage region between $V_C$ to $V_E$. Thus, operation 203 is performed to compare the lower one $D_C$ of the two center bit count differences with its other neighbor $D_D$.

If $D_C$ is no greater than its other neighbor $D_D$, $D_C$ is no greater than its neighbors $D_B$ and $D_D$. Thus, it can be inferred that a minimal can be found between the test voltages $V_C$ and $V_D$. Based on a ratio between the differences of $D_C$ from its neighbors $D_B$ and $D_D$, an estimate of the location of the optimized read voltage $V_O$ can be determined using a technique similar to that illustrated in FIG. 5.

If $D_C$ is greater than its other neighbor $D_D$, it can be assumed that a minimal can be in the highest test voltage interval between $V_D$ and $V_E$. Thus, an estimate of the location of the optimized read voltage $V_O$ can be determined using a technique similar to that illustrated in FIG. 6, based on a ratio of count differences $D_D$ and $D_C$ that are closest to the test voltages $V_D$ and $V_E$.

Similarly, if $D_B$ is no greater than $D_C$, it can be assumed that a minimal can be found on the lower half of the test voltage region between $V_A$ to $V_C$. Thus, operation 205 is performed to compare the lower one $D_B$ of the two center bit count differences with its other neighbor $D_A$.

If $D_B$ is less than its other neighbor $D_A$, $D_B$ is no greater than its neighbors $D_A$ and $D_C$. Thus, it can be inferred that a minimal can be found between the test voltages $V_B$ and $V_C$. Based on a ratio between the differences of $D_B$ from its neighbors $D_A$ and $D_C$, an estimate of the location of the optimized read voltage $V_O$ can be determined using a technique illustrated in FIG. 5.

If $D_B$ is no less than its other neighbor $D_A$, it can be assumed that a minimal can be in the lowest test voltage interval between $V_A$ and $V_B$. Thus, an estimate of the location of the optimized read voltage $V_O$ can be determined using a technique illustrated in FIG. 6, based on a ratio of the count differences $D_A$ and $D_B$ that are closest to the test voltages $V_A$ and $V_B$.

FIG. 5 illustrates a technique to estimate the location of the optimized read voltage $V_O$ when a center count difference $D_B$ is no greater than its neighbors $D_A$ and $D_C$.

Since the count difference $D_B$ is the difference of bit counts $C_B$ and $C_C$ at test voltages $V_B$ and $V_C$, the location of the optimized read voltage $V_O$ is estimated to be within the voltage interval or gap between $V_B$ and $V_C$.

When the increases from the center count difference $D_B$ to its neighbors $D_A$ and $D_C$ are substantially equal to each other, the optimized read voltage $V_O$ is estimated at the midpoint between $V_B$ and $V_C$.

The ratio between the increases from the center count difference $D_B$ to its neighbors $D_A$ and $D_C$ can be mapped in a logarithmic scale to a line scale of division between the test voltages $V_B$ and $V_C$.

For example, the ratio $(D_A-D_B)/(D_C-D_B)$ of 1 is mapped to a location of the optimized read voltage at the midpoint between the test voltages $V_B$ and $V_C$.

The ratio $(D_A-D_B)/(D_C-D_B)$ of 1/2 is mapped to a location of the optimized read voltage at the midpoint between the test voltages $V_B$ and $V_C$ with an offset of a fixed increment towards $V_B$. For example, the increment can be one tenth of the voltage gap between $V_B$ and $V_C$.

Similarly, the ratio $(D_A-D_B)/(D_C-D_B)$ of 1/4, 1/8, or 1/16 is mapped to a location of the optimized read voltage at the midpoint between the test voltages $V_B$ and $V_C$ with an offset of two, three, or four increments towards $V_B$. A ratio $(D_A-D_B)/(D_C-D_B)$ smaller than 1/16 can be mapped to a location of the optimized read voltage at $V_B$.

Similarly, the ratio $(D_C-D_B)/(D_A-D_B)$ of 1/2, 1/4, 1/8, or 1/16 is mapped to a location of the optimized read voltage at the midpoint between the test voltages $V_B$ and $V_C$ with an offset of one, two, three, or four increments towards $V_C$. A ratio $(D_C-D_B)/(D_A-D_B)$ smaller than 1/16 can be mapped to a location of the optimized read voltage at $V_C$.

The technique of FIG. 5 can be implemented via setting a coarse estimation of the optimized read voltage at $V_B$ (or $V_C$) and adjusting the coarse estimation through applying the increment according to comparison of the increase $(D_A-D_B)$ of the count difference $D_B$ to the count difference $D_A$ with fractions or multiples of the increase $(D_C-D_B)$ of the count difference $D_B$ to the count difference $D_C$. The fractions or multiples of the increase $(D_C-D_B)$ in a logarithmic scale can be computed through iterative division or multiplication by two, which can be implemented efficiently through bit-wise left shift or right shift operations.

For example, the initial estimate of the optimized voltage $V_O$ can be set at the test voltage $V_B$. The increase $(D_A-D_B)$ can be compared with $(D_C-D_B)/16$, which can be computed through shifting the bits of $(D_C-D_B)$. If $(D_A-D_B)$ is greater than $(D_C-D_B)/16$, the increment of one tenth of the gap between $V_B$ and $V_C$ can be added to the estimate of the optimized voltage $V_O$. Subsequently, $(D_A-D_B)$ is compared to $(D_C-D_B)/8$, which can be calculated by shifting the bits of $(D_C-D_B)/16$. If $(D_A-D_B)$ is greater than $(D_C-D_B)/8$, the same increment of one tenth of the gap between $V_B$ and $V_C$ is further added to the estimation of the optimized voltage $V_O$. Similarly, $(D_A-D_B)$ is compared to $(D_C-D_B)/4$, $(D_C-D_B)/2$, $(D_C-D_B)$, $(D_C-D_B)*2$, $(D_C-D_B)*4$, $(D_C-D_B)*8$, and $(D_C-D_B)*16$ one after another. If $(D_A-D_B)$ is greater than any of these scaled versions of $(D_C-D_B)$ in a comparison, the same increment is added to the estimate. After the series of comparisons, the resulting estimate can be used as the optimized voltage $V_O$.

FIG. 6 illustrates a technique to estimate the location of the optimized read voltage $V_O$ when a side count difference $D_A$ is smaller than its next two count differences $D_B$ and $D_C$, but one of its neighbors has not been measured (e.g., a count difference between the test voltage $V_A$ and a further test voltage that is lower than $V_A$).

Since the count difference $D_A$ is the lowest among count differences $D_A$, $D_B$ and $D_C$, the optimized voltage $V_O$ is estimated to be in the test voltage interval or gap corresponding to the count difference $D_A$. Since the count difference $D_A$ is the difference of bit counts $C_A$ and $C_B$ at test voltages $V_A$ and $V_B$, the location of the optimized read voltage $V_O$ is estimated to be within the voltage interval or gap between $V_A$ and $V_B$.

In FIG. 6, the location of the optimized read voltage $V_O$ within the voltage interval or gap between $V_A$ and $V_B$ is based on a ratio of the count differences $D_A$ and $D_B$. The ratio $D_A/D_B$ in a logarithmic scale is mapped to the linear distribution of the optimized read voltage $V_O$ between $V_A$ and $V_B$.

For example, the voltage interval or gap between $V_A$ and $V_B$ can be divided into five equal increments. The initial estimate of the optimized voltage $V_O$ can be set at the test voltage $V_B$. The count difference $D_A$ can be compared to scaled versions of the count difference $D_B$ sequentially, such as $D_B$, $D_B/2$, and $D_B/4$. If the count difference $D_A$ is smaller than any of the scaled versions of the count difference $D_B$ in a comparison, the estimate is reduced by the increment for moving towards the test voltage $V_A$.

In one embodiment, a method is implemented to calculate an optimized read voltage for reading a group of memory cells. The method can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. For example, the method can be implemented in a computing system of FIG. 1 with a memory device of FIG. 2 and signal noise characteristics illustrated in FIG. 3 with some of the operations illustrated in FIGS. 4-6.

In the method, a memory device 130 reads a group of memory cells (e.g., 131 or 133) in the memory device 130 at a plurality of test voltages (e.g., $V_A$, $V_B$, $V_C$, $V_D$, and $V_E$).

A read manager 113 determines bit counts (e.g., $C_A$, $C_B$, $C_C$, $C_D$, and $C_E$) at the test voltages (e.g., $V_A$, $V_B$, $V_C$, $V_D$, and $V_E$) respectively. Each bit count (e.g., $C_A$) at a test voltage (e.g., $V_A$) identifies a number of memory cells in the group (e.g., 131 or 133) that, when read at the test voltage (e.g., $V_A$), provide a predetermined bit value (e.g., 0, or 1).

The read manager 113 computes count differences (e.g., $D_A$, $D_B$, $D_C$, and $D_D$) in the bit counts for pairs of adjacent voltages in the test voltages. Each count difference (e.g., $D_A$) of a voltage interval between a pair of adjacent voltages (e.g., $V_A$ and $V_B$) in the test voltages is a difference between bit counts (e.g., $D_A$ and $D_B$) of the pair of adjacent voltages.

The read manager 113 identifies a situation in which, among the count differences (e.g., $D_A$, $D_B$, $D_C$, and $D_D$), a first count difference (e.g., $D_A$) is no greater than at least two of the count differences (e.g., $D_B$ and $D_C$), and the first count difference (e.g., $D_A$) has a voltage interval (e.g., $V_A$ to $V_B$) that is not between two voltage intervals (e.g., $V_B$ to $V_C$, and $V_C$ to $V_D$) of the at least two of the count differences (e.g., $D_B$ and $D_C$).

In response to such a situation, the read manager 113 determines a location of an optimized read voltage $V_O$ in the voltage interval (e.g., $V_A$ to $V_B$) of the first count difference (e.g., $D_A$), based on a ratio between the first count difference (e.g., $D_A$) and a second count difference (e.g., $D_B$), where the second count difference (e.g., $D_B$) has a voltage interval (e.g., $V_B$ to $V_C$) that is closest to the voltage interval (e.g., $V_A$ to $V_B$) of the first count difference (e.g., $D_A$), in the at least two of the count differences and/or in the count differences.

For example, the location of the optimized read voltage $V_O$ can be determined based on mapping a logarithmic scale of the ratio between the first count difference (e.g., $D_A$) and the second count difference (e.g., $D_B$) to a linear distribution for the location (e.g., $V_A$) and the test voltage (e.g., $V_B$) of the optimized read voltage $V_O$ in the voltage interval (e.g., $V_A$ to $V_B$) of the first count difference (e.g., $D_A$).

For example, the location of an optimized read voltage $V_O$ within the voltage interval (e.g., $V_A$ to $V_B$) of the first count difference (e.g., $D_A$) can be determined without performing floating point number operations.

For example, the read manager 113 can generate a plurality of scaled versions of at least one of the first count difference (e.g., $D_A$) and the second count difference (e.g., $D_B$). The read manager 113 can determine the location of the optimized read voltage $V_O$ based on comparison performed based on the scaled versions.

For example, the scaled versions can be generated by a shifting operation. For example, shifting bit-wise a number to the left by one bit can scale the number up by a factor of two; and shifting bit-wise the number to the right by one bit can scale the number down by a factor of two. Thus, the scaled versions can be scaled by factors of two to the power of predetermined numbers without performing floating point number operations.

For example, the scaled versions can be generated by repeatedly scaling by a factor of two; and the determining of the location of the optimized read voltage can be made via comparing a non-scaled one of the first count difference (e.g., $D_A$) and the second count difference (e.g., $D_B$) to the scaled versions one after another.

For example, the determining of the location of the optimized read voltage $V_O$ can include: set the location initially at one of test voltages (e.g., $V_A$ and $V_B$) corresponding to the voltage interval of the first count difference (e.g., $D_A$); and adjust the location by a predetermined amount in response to a determination that a predetermined relation is satisfied between: the non-scaled one of the first count difference (e.g., $D_A$) and the second count difference (e.g., $D_B$), and a scaled version in the plurality of scaled versions.

For example, the read manager 113 initially sets the location at a test voltage $V_B$ that separates the voltage interval $V_A$ to $V_B$ of the first count difference $D_A$ and the voltage interval $V_B$ to $V_C$ of the second count difference $D_B$. The read manager 113 compares the first count difference $D_A$ and the second count difference $D_B$.

In response to a determination that the first count difference $D_A$ is smaller than the second count difference $D_B$, the read manager 113 moves the location away from the voltage interval $V_B$ to $V_C$ of the second count difference $D_B$ by a predetermined amount (e.g., one fifth of the voltage interval $V_A$ to $V_B$).

The read manager 113 scales the second count difference $D_B$ down by a factor of two to generate a scaled version of the second count difference (e.g., $D_B/2$), compares the first count difference $D_A$ and the scale version of the second count difference (e.g., $D_B/2$), and in response to a determination that the first count difference $D_A$ is smaller than the scaled version of the second count difference (e.g., $D_B/2$), moves the location further away from the voltage interval $V_B$ to $V_C$ of the second count difference $D_B$ by the predetermined amount (e.g., one fifth of the voltage interval $V_A$ to $V_B$).

The comparison between $D_A$ and $D_B/2$ is equivalent to comparing $D_A/D_B$ and 1/2, which can be performed alternatively by comparing $D_A*2$ and $D_B$.

Subsequently, the read manager 113 can further scale $D_B/2$ down by a factor of two to generate a further scaled version of the second count difference (e.g., $D_B/4$), and compare the first count difference $D_A$ and the further scale version of the second count difference (e.g., $D_B/4$). In response to a determination that the first count difference $D_A$ is smaller than the further scaled version of the second count difference (e.g., $D_B/4$), the read manager 113 further moves the location even further away from the voltage interval $V_B$ to $V_C$ of the second count difference $D_B$ by the predetermined amount (e.g., one fifth of the voltage interval $V_A$ to $V_B$).

The comparison between $D_A$ and $D_B/2$ is equivalent to comparing $D_A/D_B$ and 1/4, which can be performed alternatively by comparing $D_A*2$ and $D_B/2$, or by comparing $D_A*4$ and $D_B$.

Figure 8:
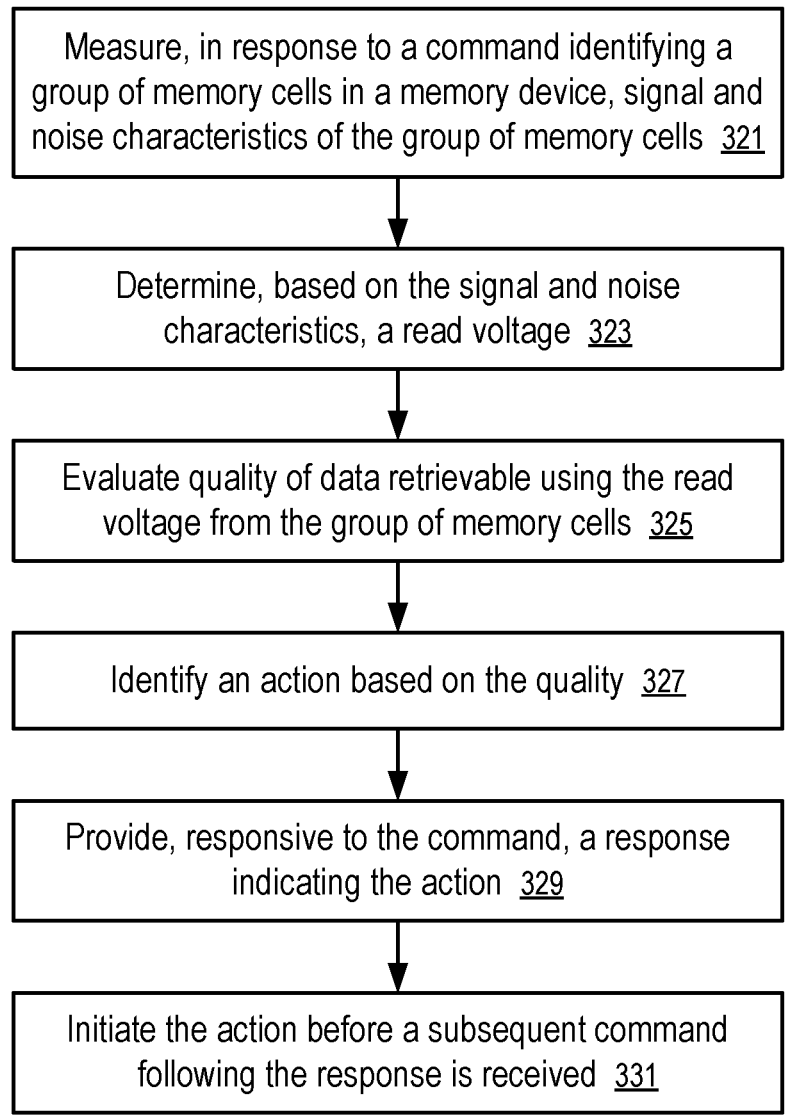
FIG. 8 shows a method of intelligent proactive responses to operations of reading data from memory cells according to one embodiment.

In one embodiment, a method is implemented to determine whether an optimized read voltage for reading a group of memory cells is located in a correct voltage range. The method can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 8 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. For example, the method can be implemented in a computing system of FIG. 1 with a memory device of FIG. 2 and signal noise characteristics illustrated in FIG. 3 with some of the operations illustrated in FIGS. 4-6.

In the method, a memory device 130 programs a group of memory cells (e.g., 131 or 133) to store multiple bits per memory cell. The group of memory cells has multiple pages corresponding to the multiple bits per memory cell respectively.

For example, the group of memory cells (e.g., 131 or 133) can be programmed in a QLC mode; the collection the first bit in each memory cell in the group (e.g., 131 or 133) forms a lower page; the collection of the second bit in each memory cell in the group (e.g., 131 or 133) forms an upper page; the collection of the third bit in each memory cell in the group (e.g., 131 or 133) forms an extra page; and the collection of the fourth bit in each memory cell in the group (e.g., 131 or 133) forms a top page.

The read manager 113 determines a plurality of read voltages (e.g., $V_P$) of the group of memory cells.

The memory device 130 reads the multiple pages using the plurality of read voltages (e.g., $V_P$).

The read manager 113 determines, for each respective page in the multiple pages, a count of first memory cells in the respective page, where each of the first memory cells has a threshold voltage higher than the highest read voltage, among the plurality of read voltages, used to read the respective page.

The read manager 113 compares the count of the first memory cells with a predetermined range of a fraction of memory cells in the respective page to evaluate the plurality of read voltages.

For example, as illustrated in FIG. 3, each respective read voltage $V_O$ in the plurality of read voltages can be determined by the group of memory cells at a plurality of test voltages $V_A$, $V_B$, $V_C$, $V_D$, and $V_E$ that are evenly distributed in a test voltage range from $V_A$ to $V_B$. Bit counts $C_A$, $C_B$, $C_C$, $C_D$, and $C_E$ can be determined at the test voltages $V_A$, $V_B$, $V_C$, $V_D$, and $V_E$ respectively. Then, count differences $D_A$, $D_B$, $D_C$, and $D_D$ can be determined for the test voltage intervals from $V_A$ to $V_B$, from $V_B$ to $V_C$, from $V_C$ to $V_D$, and from $V_D$ to $V_E$ respectively. The respective read voltage $V_O$ can be calculated based on the count differences $D_A$, $D_B$, $D_C$, and $D_D$ and the length G of the test voltage intervals.

For example, as illustrated in FIG. 5, in response to a determination that a first count difference $D_B$ on a first test voltage interval $V_B$ to $V_C$ is no greater than a second count difference $D_A$ on a second test voltage interval $V_A$ to $V_B$ that is lower than the first test voltage interval $V_B$ to $V_C$ and no greater than a third count difference $D_C$ on a third test voltage interval $V_C$ to $V_D$ that is higher than the first test voltage interval $V_B$ to $V_C$, the determining of the respective read voltage can be based on a ratio between: an increase $(D_A-D_B)$ from the first count difference $D_B$ to the second count difference $D_A$; and an increase $(D_C-D_B)$ from the first count difference $D_B$ to the third count difference $D_C$.

For example, as illustrated in FIG. 6, in response to a determination that a first count difference $D_A$ on a first test voltage interval $V_A$ to $V_B$ is no greater than at least two count differences $D_B$ and $D_C$ on test voltage intervals that are all lower, or all higher, than the first test voltage interval $V_A$ to $V_B$, the determining of the respective read voltage can be based on a ratio between: the first count difference $D_A$, and a second count difference $D_B$ on a test voltage interval $V_B$ to $V_C$ that is closest to the first test voltage interval $V_A$ to $V_B$ among the at least two count differences.

Test voltage ranges for determination of the plurality of read voltages (e.g., from $V_A$ to $V_E$ for $V_O$) do not overlap with each other. The collection of the test voltage ranges covers a small portion of the voltage span where optimized read voltages can be in. When a test voltage range (e.g., $V_A$ to $V_E$) is at a wrong location, the read voltage calibrated/optimized based on the test voltage range is in a wrong voltage range. In response to a determination that the count of the first memory cells is outside of the predetermined range of the fraction, the read manager can determine that at least one of the test voltage ranges (e.g., $V_A$ to $V_E$) is incorrectly positioned. In response, the memory device 130 can initiate a search for an improved test voltage range for the calibration of the read voltage, and/or provide a response to the controller 115 of the memory sub-system 110 to suggest a search for an improved test voltage range for read voltage calibration/optimization.

For example, when the group of memory cells is programmed in a quad-level cell (QLC) mode, the predetermined range of the fraction can be based on the type of the page. For example, when the respective page is a top page, the predetermined range of the fraction is between 1/32 and 3/32; when the respective page is an extra page, the predetermined range of the fraction is between 3/32 and 5/32; when the respective page is an upper page, the predetermined range of the fraction is between 7/32 and 9/32; and when the respective page is a lower extra page, the predetermined range of the fraction is between 15/32 and 17/32.

Figure 7:
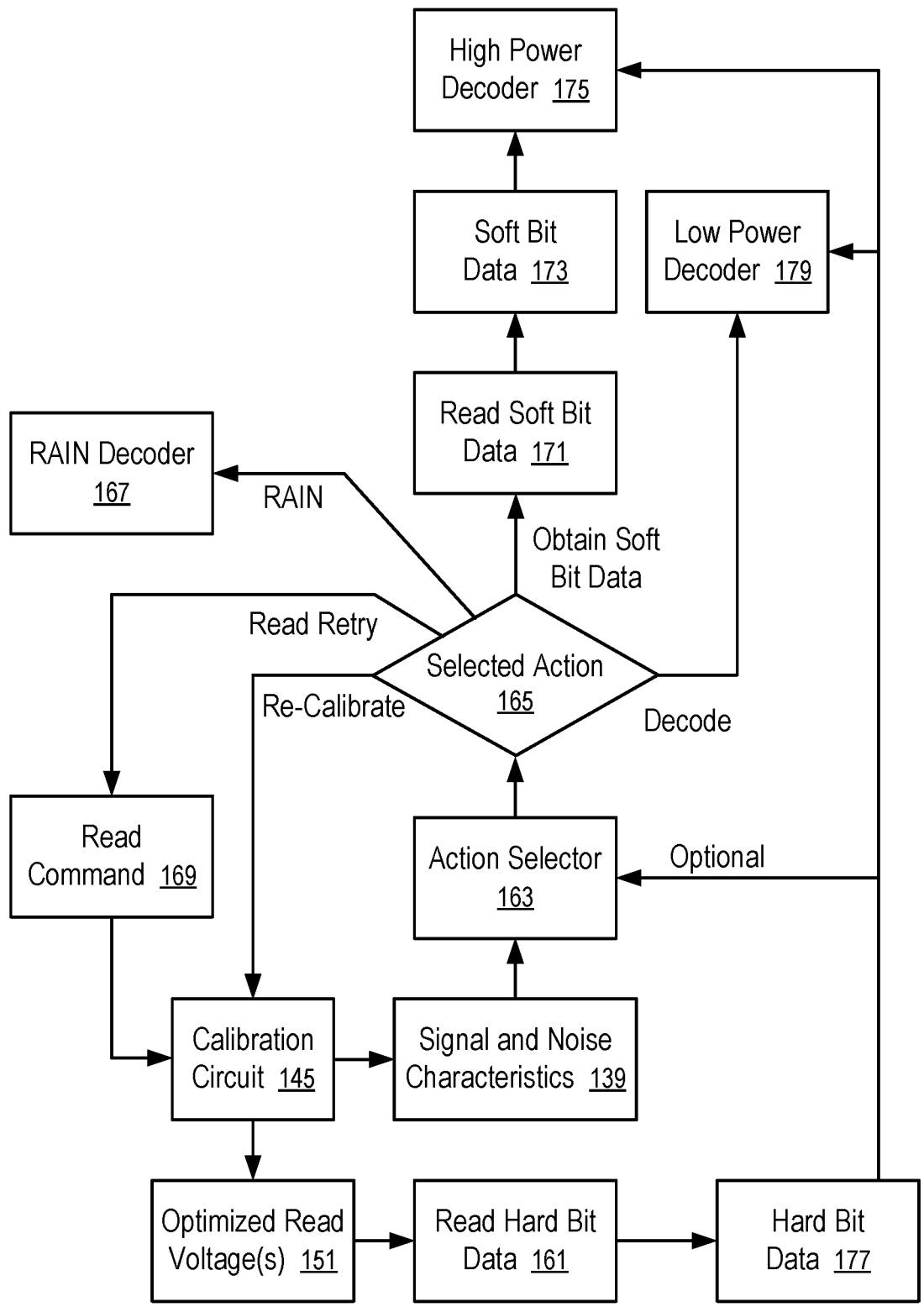
FIG. 7 illustrates responses to read operations according to one embodiment.

FIG. 7 illustrates responses to read operations according to one embodiment. For example, the responses illustrated in FIG. 7 can be implemented in a memory sub-system 110 of FIG. 1 having an integrated circuit memory device 130 of FIG. 2, using the signal and noise characteristics 139 measured according to FIG. 3.

In FIG. 7, in response to a read command 169 identifying a group of memory cells (e.g., 131 or 133) using an address 135, a calibration circuit 145 of a memory device 130 measures signal and noise characteristics 139 (e.g., in a way illustrated in FIG. 3).

The calibration circuit 145 uses the signal and noise characteristics 139 to compute optimized read voltage(s) 151 (e.g., in a way illustrated in FIGS. 4-6). The optimized read voltage(s) 151 can be used to read 161 hard bit data 177 from the group of memory cells (e.g., 131 or 133).

A read manager 113 of the memory device 130, and/or a read manager 114 of the controller 115 of the memory sub-system 110, can have an action selector 163. The action selector 163 uses the signal and noise characteristics 139 to evaluate the quality of the hard bit data 177 before, or concurrently with, the reading 161 of the hard bit data 177.

Based on the evaluated quality of the hard bit data 177, the action selector 163 can suggest an action such as decoding the hard bit data 177 without soft bit data 173, obtaining soft bit data, re-calibrating the optimized read voltage, read retry, etc.

For example, the bit error rate of the hard bit data 177 can be classified by using the signal and noise characteristics 139 in a predictive model, or estimated by using the signal and noise characteristics 139 in an empirical formula. When the bit error rate is classified as low (or has an estimate that is below a threshold), the action selector 163 can suggest decoding the hard bit data 177 using a low power decoder 179 that does not use soft bit data 173.

Optionally, the low power decoder 179 is implemented in the memory device 130. The memory device 130 can provide a signal to the controller 115 of the memory sub-system 110 to extend a response time period for the read command 169 for the completion of the decoding operation by the low power decoder 179. Subsequently, the memory device 130 can provide, as a response to the read command 169, the output from the low power decoder 179, instead of the hard bit data 177.

Alternatively, the low power decoder 179 is implemented in the controller 115 of the memory sub-system 110; and the memory device 130 provides the hard bit data 177 as a response to the read command 169.

The optimized read voltage calculated using the techniques of FIGS. 4-6 can be classified as optimal or sub-optimal.

For example, when the optimized read voltage is found based on a count difference (e.g., $D_B$) that is between two larger neighbors (e.g., $D_A$ and $D_C$), the technique of FIG. 5 is used to calculate an optimal estimate of the read voltage $V_O$.

For example, when the optimized read voltage is found without a count difference (e.g., $D_A$) that is between two larger neighbors, the technique of FIG. 6 is used to calculate a sub-optimal estimate of the read voltage $V_O$.

When the bit error rate is classified as high (or has an estimate that is above a threshold) but the optimized read voltage is optimal, the action selector 163 can suggest obtaining soft bit data 173. Thus, the memory device 130 can further read 171 soft bit data 173 proactively and provide the soft bit data 173 and the hard bit data 177 for decoding using a high power decoder 175. The high power decoder 175 consumes more energy than the low power decoder but has a better capability to recovery from errors in decoding. For example, the high power decoder 175 can be implemented in the controller 115 of the memory sub-system 110. Alternatively, the high power decoder 175 can be implemented in the memory device 130.

When the bit error rate is classified as high (or has an estimate that is above a threshold) and the optimized read voltage is sub-optimal, the action selector 163 can suggest re-calibrating the optimized read voltages (151) for a calibrated read voltage that is optimal. For example, when optimized voltage is determined to be within the voltage range $V_A$ and $V_B$, the memory device 130 can adjust the test voltages to capture the optimized voltage $V_O$ between two larger neighbors. For example, the subsequent calibration can be performed by setting $V_C$ at the current sub-optimal estimate of $V_O$.

Optionally, the memory device 130 can suggest a read retry to the controller 115 of the memory sub-system 110 and proactively start the read retry before the controller 115 of the memory sub-system 110 issues a command for read retry. The proactive action can reduce the time to complete the read retry.

For example, when an optimized/calibrated read voltage is found to be based on a wrong test voltage range, the action selector 163 can suggest read retry to the controller 115 of the memory sub-system 110.

In some implementations, when the memory device 130 determines, based on the signal and noise characteristics 139, that it is unlikely to be successful in decoding the hard bit data 177 with the soft bit data 173 using a set of read voltages that can be calibrated/determined by the calibration circuit 145, the action selector 163 can suggest a RAIN operation to the controller 115 of the memory sub-system 110. A RAIN decoder 167 implemented in the controller 115 of the memory sub-system 110 can use redundant information stored in other memory devices to recover the data of the group of the memory cells (e.g., 131 or 133).

FIG. 8 shows a method of intelligent proactive responses to operations of reading data from memory cells according to one embodiment. The method of FIG. 8 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 8 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 8 can be implemented in a computing system of FIG. 1 with a memory device of FIG. 2 and signal noise characteristics illustrated in FIG. 3 with some of the operations illustrated in FIGS. 4-6.

At block 321, in response to a command identifying a group of memory cells (e.g., 131 or 133) in a memory device 130, a calibration circuit 145 of a memory device 130 measures signal and noise characteristics 139 of the group of memory cells (e.g., 131 or 133).

At block 323, a read manager 113 determines a read voltage 151 based on the signal and noise characteristics 139.

At block 325, the read manager 113 evaluates the quality of data (e.g., 177 and/or 173) retrievable using the read voltage 151 from the group of memory cells (e.g., 131 or 133).

At block 327, an action selector 163 identifies an action based on the quality.

At block 329, the memory device 130 provides, responsive to the command, a response indicating the action.

At block 331, the memory device 130 initiates proactively the action before a subsequent command, following the response, is received in the memory device 130.

For example, to evaluate the quality of the data (e.g., 177 and/or 173), the memory device 130 determines whether an error rate of the data is in a low error rate category and a high error rate category. Further, the memory device 130 determines whether the read voltage 151 is in optimal or sub-optimal, and/or whether the read voltage 151 is in a wrong voltage range.

For example, the memory sub-system 110 can have a low power decoder 179 implemented in the memory device 130 and a high power decoder 175 implemented in the controller 115 of the memory sub-system 110.

When the error rate is low, the action can be decoding, using the low power decoder 179, hard bit data 177 retrieved by reading the group of memory cells at the read voltage, without reading the soft bit data 173.

When the error rate is high but the read voltage 151 is optimal, the action can be reading soft bit data 173 from the group of memory cells (e.g., 131 or 133) at voltages (e.g., 181 and 182) having predetermined offsets (e.g., 183 and 184) from the read voltage 151 such that the high power decoder 175 can be used to decode the hard bit data 177 with the soft bit data 173.

When the error rate is high, and the read voltage 151 is sub-optimal but not in a wrong voltage range, the action can be re-calibration of the read voltage.

When the read voltage 151 is determined to be in a wrong voltage range, the action can be retrying read and/or searching for a voltage range to calibrate the read voltage.

A non-transitory computer storage medium can be used to store instructions of the firmware of a memory sub-system (e.g., 110). When the instructions are executed by the controller 115 and/or the processing device 117, the instructions cause the controller 115, the processing device 117, and/or a separate hardware module to perform the methods discussed above.

Figure 9:
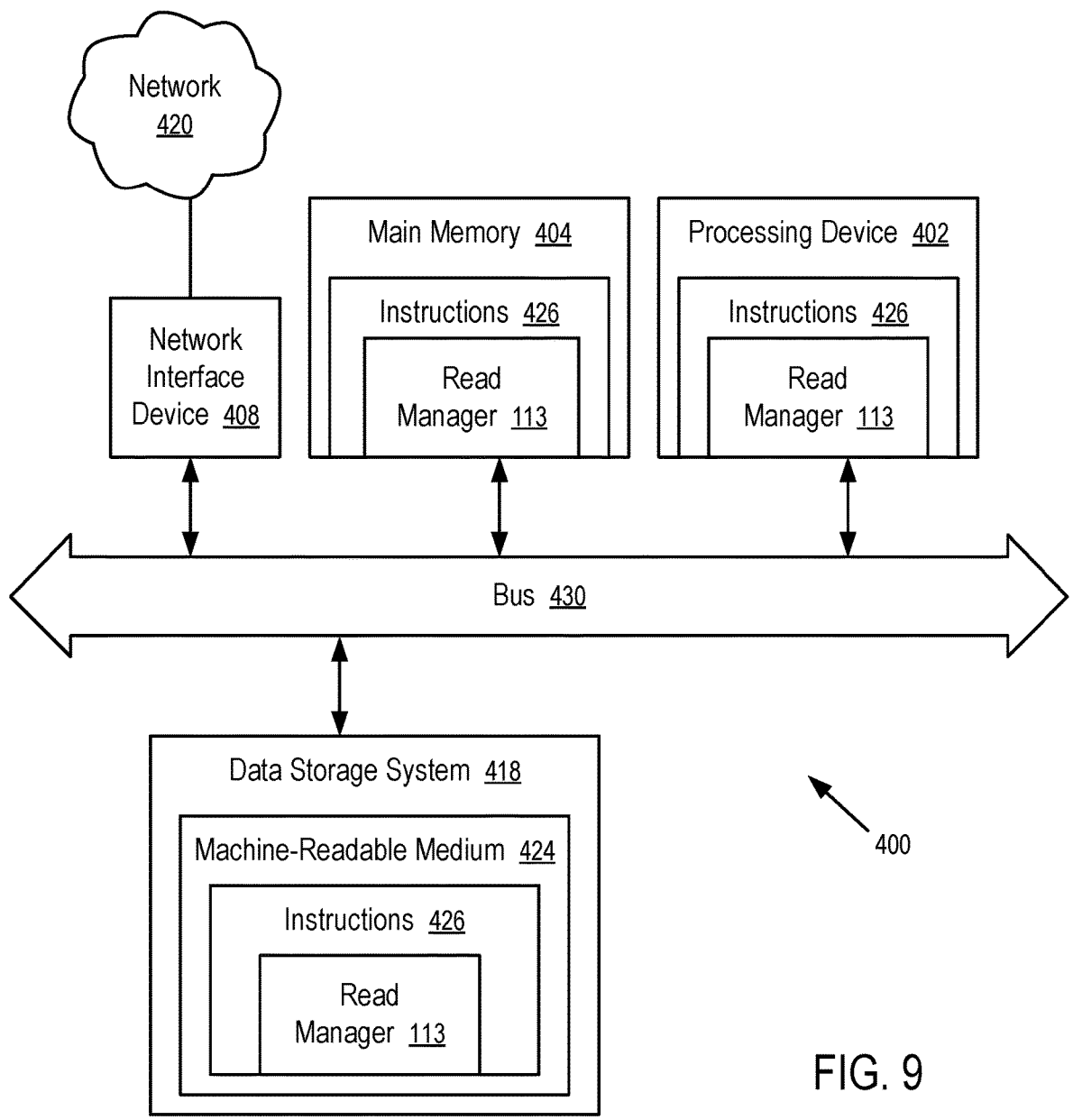
FIG. 9 is a block diagram of an example computer system in which embodiments of the present disclosure can operate.

FIG. 9 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a read manager 113 (e.g., to execute instructions to perform operations corresponding to the read manager 113 described with reference to FIGS. 1-8). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a read manager 113 (e.g., the read manager 113 described with reference to FIGS. 1-8). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device, comprising:
   an integrated circuit package enclosing the memory device; and
   a plurality of groups of memory cells formed on at least one integrated circuit die;
   wherein in response to a command identifying a group of memory cells within the plurality of groups, the memory device is configured to,
      measure signal and noise characteristics of the group of memory cells;
      determine, based on the signal and noise characteristics, a read voltage;
      evaluate quality of data retrievable using the read voltage from the group of memory cells;
      identify an action based on the quality;
      provide, responsive to the command, a response indicating the action; and
      initiate the action before a subsequent command following the response is received.

2. The memory device of claim 1, wherein to measure the signal and noise characteristics, the memory device is configured to:

read the group of memory cells at a plurality of test voltages that are evenly distributed in a test voltage range;

determine bit counts at the test voltages respectively, wherein each bit count at a test voltage identifies a number of memory cells in the group that, when read at the test voltage, provide a predetermined bit value; and compute count differences in the bit counts for pairs of adjacent voltages in the test voltages, wherein each count difference of a voltage interval between a pair of adjacent voltages in the test voltages is a difference between bit counts of the pair of adjacent voltages;

wherein the read voltage is determined based on the count differences.

3. The memory device of claim 2, wherein to evaluate the quality, the memory device is configured to classify a bit error rate of the data retrievable from the group of memory cells using the read voltage.

4. The memory device of claim 3, wherein the bit error rate is classified by applying the signal and noise characteristics in a predictive model or an empirical formula.

5. The memory device of claim 3, wherein in response to a determination that the bit error rate is classified into a first category of bit error rates lower than a second category, the action includes decoding hard bit data read using the read voltage.

6. The memory device of claim 3, wherein in response to a determination that the bit error rate is classified into a second category of bit error rates higher than a first category, the memory device is configured to determine whether the read voltage is optimal or sub-optimal.

7. The memory device of claim 6, wherein when a first count difference on a first test voltage interval is no greater than a second count difference on a second test voltage interval that is lower than the first test voltage interval and a third count difference on a third test voltage interval that is higher than the first test voltage interval, the memory device is configured to:

determine that the read voltage is optimal; and calculate the respective read voltage based on a ratio between:
an increase from the first count difference to the second count difference, and
an increase from the first count difference to the third count difference, wherein in response to a determination that the bit error rate is in the second category and the read voltage is optimal, the action includes reading the group of memory cells for soft bit data at voltages having predetermined offsets from the read voltage.

8. The memory device of claim 6, wherein when a first count difference on a first test voltage interval is no greater than at least two count differences on test voltage intervals that are both lower or both higher than the first test voltage interval, the memory device is configured to:

calculate the read voltage based on a ratio between:
the first count difference, and
a second count difference on a test voltage interval that is closest to the first test voltage interval among the at least two count differences; and determine that the read voltage is sub-optimal;

wherein in response to a determination that the bit error rate is in the second category and the read voltage is sub-optimal, the action includes re-calibrating the read voltage.

9. The memory device of claim 3, wherein the memory device is further configured to determine whether the read voltage is in a wrong voltage range; and in response to a determination that the read voltage is in a wrong voltage range, the action includes read retry, or search for a range to calibrate the read voltage, or any combination thereof.

10. A method, comprising:

measuring, in response to a command identifying a group of memory cells in a memory device, signal and noise characteristics of the group of memory cells;

determining, based on the signal and noise characteristics, a read voltage;

evaluating quality of data retrievable using the read voltage from the group of memory cells;

identifying an action based on the quality;

providing, responsive to the command, a response indicating the action; and initiating the action before a subsequent command following the response is received.

11. The method of claim 10, wherein the measuring of the signal and noise characteristics comprises:

reading the group of memory cells at a plurality of test voltages that are evenly distributed in a test voltage range;

determining bit counts at the test voltages respectively, wherein each bit count at a test voltage identifies a number of memory cells in the group that, when read at the test voltage, provide a predetermined bit value; and computing count differences in the bit counts for pairs of adjacent voltages in the test voltages, wherein each count difference of a voltage interval between a pair of adjacent voltages in the test voltages is a difference between bit counts of the pair of adjacent voltages;

wherein the read voltage is determined based on the count differences.

12. The method of claim 11, wherein the evaluating of the quality includes classifying a bit error rate of the data retrievable from the group of memory cells using the read voltage based on applying the signal and noise characteristics in a predictive model or an empirical formula.

13. The method of claim 12, wherein in response to a determination that the bit error rate is classified into a first category of bit error rates lower than a second category, the action includes decoding hard bit data read using the read voltage.

14. The method of claim 12, further comprising:

determining whether the read voltage is optimal or sub-optimal;

wherein in response to a determination that there is a first count difference on a first test voltage interval, the first count difference being no greater than a second count difference on a second test voltage interval that is lower than the first test voltage interval and a third count difference on a third test voltage interval that is higher than the first test voltage interval, the read voltage is determined to be optimal; and wherein in response to a determination that there is the first count difference on a first test voltage interval is no greater than at least two count differences on test voltage intervals that are both lower or both higher than the first test voltage interval, the read voltage is determined to be sub-optimal.

15. The method of claim 14, wherein in response to a determination that the bit error rate is in a second category of bit error rates higher than a first category and the read voltage is optimal, the action includes reading the group of memory cells for soft bit data at voltages having predetermined offsets from the read voltage.

16. The method of claim 14, wherein in response to a determination that the bit error rate is in a second category of bit error rates higher than a first category and the read voltage is sub-optimal, the action includes re-calibrating the read voltage.

17. The method of claim 12, further comprising:
determining whether the read voltage is in a wrong voltage range;
wherein, in response to a determination that the read voltage is in a wrong voltage range, the action includes read retry, or search for a range to calibrate the read voltage, or any combination thereof.

18. A memory sub-system, comprising:
a processing device; and
at least one memory device, the memory device having a group of memory cells formed on an integrated circuit die;
wherein the processing device is configured to transmit, to the memory device, a command with an address identifying the group of memory cells;
wherein in response to the command, the memory device is configured to:
determine a read voltage based on signal and noise characteristics of the group of memory cells;
identify, based on the signal and noise characteristics, an action according to quality of data retrievable using the read voltage from the group of memory cells;
provide, responsive to the command, a response indicating the action; and
initiate the action before a subsequent command is received after the response.

19. The memory sub-system of claim 18, wherein to evaluate the quality the memory device is further configured to:
determine whether an error rate of the data is in a first category and a second category, wherein error rates in the first category are lower than error rates in the second category;
determine whether the read voltage is optimal or sub-optimal; and
determine whether the read voltage is in a wrong voltage range.

20. The memory sub-system of claim 19, further comprising:
a first decoder; and
a second decoder that consumes more energy than the first decoder;
wherein the action is:
decoding, using a first decoder, hard bit data retrieved by reading the group of memory cells at the read voltage;
reading soft bit data from the group of memory cells at voltages having predetermined offsets from the read voltage to use the second decoder to the hard bit data and the soft bit data;
re-calibrating the read voltage;
retrying read; or
searching for a voltage range to calibrate the read voltage.

* * * * *